United States Patent
Balasa et al.

(10) Patent No.: US 6,550,046 B1
(45) Date of Patent: Apr. 15, 2003

(54) METHOD FOR AUTOMATED PLACEMENT OF CELLS IN AN INTEGRATED CIRCUIT LAYOUT

(75) Inventors: Florin Balasa, Tustin, CA (US); Koen Lampaert, Laguna Beach, CA (US)

(73) Assignee: Conexant Systems, Inc., Newport Beach, CA (US)

(*) Notice: Subject to any disclaimer, the term of this patent is extended or adjusted under 35 U.S.C. 154(b) by 0 days.

(21) Appl. No.: 09/411,417

(22) Filed: Oct. 1, 1999

Related U.S. Application Data

(60) Provisional application No. 60/103,509, filed on Oct. 8, 1998.

(51) Int. Cl.⁷ .............................................. G06F 17/50

(52) U.S. Cl. .................................. 716/8; 716/2; 716/11

(58) Field of Search ........................... 716/11, 2, 9, 10, 716/8; 703/13

(56) References Cited

PUBLICATIONS

Bourai, "Symmetry detection for automatic analog layout recycling", IEEE Jan. 1999. pp. 5–8.*

Hatta, K. et al., "Solving the rectangular packing problem by an adaptive GA based on sequence–pair", Jan. 1999, IEEE, pp. 181–184.*

Murata, H. et al., "Rectangule–packing based module placement", Nov. 1995, IEEE, pp. 472–479.*

Malavasi, E. et al., "Automation of IC layout with analog constraints", Aug. 1996, IEEE, pp. 923–942.*

F. Balasa, K. Lampaert, "Module Placement for Analog Layout Using the Sequence–Pair Representation," *Proc. 36th ACM/IEEE Design Automation Conf.*, pp. 274–279, New Orleans. LA, Jun. 1999.

Y.–X Pang, F. Balasa, K. Lampaert, C.–K. Cheng, "Block Placement with Symmetry Constraints Based on the O–Tree Non–Slicing Representation," *Proc. 37th ACM/IEEE Design Automation Conf.*, pp. 464–467, Los Angeles CA, Jun. 2000.

F. Balasa, K. Lamaert, "Symmetry Within the Sequence–Pair Representation in the Context of Placement for Analog Design," *IEEE Trans. On Comp.–Aided Design of Integrated Circuits and Systems*, vol. 19, No. 7, pp. 721–731, Jul. 2000.

F. Balasa, "Modeling Non–Slicing Floorplans with Binary Trees," *Proc. IEEE Int. Conf. Comp.–Aided Design*, pp. 13–16, San Jose CA, Nov. 2000.

F. Balasa, "Device–Level Placement for Analog Layout: An Opportunity for Non–Slicing Topological Representations,", *Proc. Asia South Pacific Design Automation Conf.*, pp. 281–286, Yokohama, Japan, Jan.–Feb. 2001.

F. Balasa, S.C. Maruvada, "Using Non–Slicing Topological Representations for Analog Placement," *IEICE Trans. On Fundamentals of Electronics, Communications and Computer Sciences* (Special Section on VLSI Designa nd CAD Algorithms), Japan 2001.

(List continued on next page.)

*Primary Examiner*—John F. Niebling
*Assistant Examiner*—Stacy A Whitmore
(74) *Attorney, Agent, or Firm*—Thomas, Kayden, Horstemeyer & Risley, LLP

(57) ABSTRACT

An automated method for packing cells in the generation of an integrated circuit design layout that is especially useful for circuits having symmetry constraints, which is the case for most analog circuits, uses sequence pair encoding and simulated annealing. From the set of all cells needed to implement the circuit, subsets of the cells are defined that must exhibit symmetry. Symmetry constraints are defined for each subset and the cells are encoded as ordered sequence-pairs. To reduce the solution space, the initial sequence pair encoding is required to be symmetry-feasible and the annealer subspace is limited to symmetry-feasible sequence-pairs.

20 Claims, 3 Drawing Sheets

OTHER PUBLICATIONS

IEEE Journal Article titled KOAN / ANAGRAM II: New Tools for Device–Level Analog Placement and Routing, by John M. Cohn, et al., 1991, pp. 330–342.

Article titled An O–Tree Representation of Non–Slicing Floorplan and Its Applications, by Pei–Ning Guo, et al., 1999, pp. 268–273.

IEEE Journal Article titled "A New Algorithmm for Floorplan Design", by D.F. Wong and C.L. Liu, 1986, pp. 101–107.

IEEE Journal Article titled "Genetic Placement", by James P. Cohoon and William D. Paris, 1987, pp. 956–964.

IEEE Journal Article titled "SALIM: A Layout Generation Tool for Analog ICs", by M. Kayal, et al., 1988, pp. 7.5.1–7.5.4.

IEEE Journal Article titled GORDIAN: VLSI Placement by Quadratic Programming and Slicing Optimization, by Jurgen M. Kleinhans, et al., 1991, pp. 356–365.

IEEE Journal Article titled "A Performance–Driven Placement Tool for Analog Integrated Circuits", by Koen lampaert, et al., 1995, pp. 773–780.

Article titled "Module Placement for Analog Layout Using the Sequence–Pair Representation", by Florin Balasa and Koen Lampaert, 1999, pp. 274–279.

IEEE Journal Article titled "Module Packing Based on the BSG–Structure and IC Layout", by Shigetoshi Nakatake, et al., 1998, pp. 519–530.

Society for Industrial and Applied Mathematics Article titled "Orthogonal Packings in Two Dimensions", by Brenda S. Baker, et al., 1980, pp. 846–855.

IEEE Journal Article titled "An Efficient Methodology for Symbolic Compaction of Analog IC's wiht Multiple Symmetry Constraints", by Eric Felt, et al., 1992, pp. 148–153.

IEEE Journal Article titled "Automation of IC Layout with Analog Constraints", by Enrico Malavasi, et al., 1996, pp. 923–942.

IEEE Journal Article titled "Quick Placement with Geometric Constraints", by Enrico Malavasi, et al., 1997, pp. 561–564.

IEEE Journal Article titled "STAT: A Schematic to Artwork Translator for Custom Analog Cells", by Stacy W. Mehranfar, 1990, pp. 30.2.1–30.2.3.

Article for IEEE Design Automoation Conference titled "Branch–and Bound Placement for Building Block Layout", by Hidetoshi Onodera, et al., 1991, pp. 433–439.

IEEE Journal Article titled "ILAC: An Automated Layout Tool for Analog CMOS Circuits", by Jef RijMenants, et al., 1989, pp. 417–423.

IEEE Journal Article titled "Efficient and Effective Placement for Very Large Circuits", by Wern–Jieh Sun and Carl Sechen, 1995, pp. 349–359.

IEEE Journal Article titled "An Analytical Approach to Floorplan Design and Optimization", by Suphachai Sutanthavibul, et al., 1991, pp. 761–769.

IEEE Journal Article titled "An Analytical Approach to Floorplanning for Hierarchical Building Blocks Layout", by Chang–Sheng Ying and Joshua Sook–Leung Wong, 1989, pp. 403–412.

IEEE Journal Article titled "VLSI Module Placement Based on Rectangle–Packing by the Sequence–Pair", by Hiroshi Murata, et al., 1996, pp. 1518–1524.

IEEE Journal Article titled "The Timberwolf Placement and Routing Package", by Carl Sechen and Alberto Sangiovanni–Vincentelli, 1985, pp. 510–522.

The Kluwer International Series in Engineering and Computer Science article titled "Analog Device–Level Layout Automation", by John M. Cohn, et al., pp. vi–vii and pp. 21–104.

Article titled "Virtual Symmetry Axes for the Layout of Analog IC's", by Enrico Malavasi, et al., pp. 1–10.

The Kluwer International Series in Engineering and Computer Science article titled "Analog Layout Generation for Performance and Manufacturability", by Koen Lampaert; et al., pp. 71–118.

* cited by examiner

METHOD FOR AUTOMATED PLACEMENT OF CELLS IN AN INTEGRATED CIRCUIT LAYOUT

CROSS REFERENCE TO RELATED APPLICATION

This application claims priority from provisional application, Serial No. 60/103,509 filed Oct. 8, 1998.

BACKGROUND OF THE INVENTION

This invention relates generally to a method for the automated placement of cells in the generation of an automated layout of an integrated circuit, and more specifically to a method for the automated placement of cells in an integrated circuit layout that accommodates symmetry constraints that are often encountered in the layout of analog devices.

A number of techniques exist for the computer-aided design (CAD) and layout of integrated circuit devices. The integrated circuit device is first divided into a number of cells that can be used to implement the desired integrated circuit function. The cells can be, for example, an individual device, a capacitor, or, often, a plurality of transistors and other devices that make up a logic block. Most of the prior art techniques then involve the placement of the cells either in accordance with a trial and error method or in accordance with a mathematical algorithm. The known placement techniques usually handle the cells as rectangles and move and position the rectangular cells in such a manner to optimize the size of the integrated circuit layout.

Although the known automated layout techniques are not ideal, they are reasonably effective for providing a workable layout for digital circuits. Unfortunately, however, the known techniques are not practical or efficient for optimum layout of an analog integrated circuit. In addition to the obvious functional differences between analog and digital circuits, analog circuits differ from digital circuits in that an analog circuit layout often requires aspects of symmetry and device matching in order for the resulting integrated circuit to achieve optimum performance.

Known techniques for laying out integrated circuits are not efficient for laying out circuits requiring symmetry and matching. Dealing with symmetry and matching using the known automated layout techniques requires unacceptable amounts of computing time and/or computing power.

A need therefore existed for an improved method for the automated placement of cell in the generation of integrated circuit layouts, and especially for the automated placement of cells in the layout of analog circuits that require aspects of device symmetry and device matching.

BRIEF SUMMARY OF THE INVENTION

In accordance with one embodiment of the invention, a method is provided for the automated packing of an integrated circuit layout, and especially for the automated packing of an integrated circuit layout within which certain cells of the circuit must be symmetrically arranged. In accordance with one embodiment of the invention, the circuit to be designed is considered as a plurality of generally rectangular cells. From the plurality of cells making up the integrated circuit, a subset of cells that must exhibit symmetry are identified. Symmetry constraints are defined for the subset of symmetric cells. The packing of the cells, in accordance with one embodiment of the invention, is encoded as ordered sequence-pairs starting with an initial sequence-pair that is symmetric-feasible. The encoding is then optimized using simulated annealing, with each movement of cells during the annealing subject to the symmetry constraints.

DETAILED DESCRIPTION OF PREFERRED EMBODIMENTS

Figure 1:
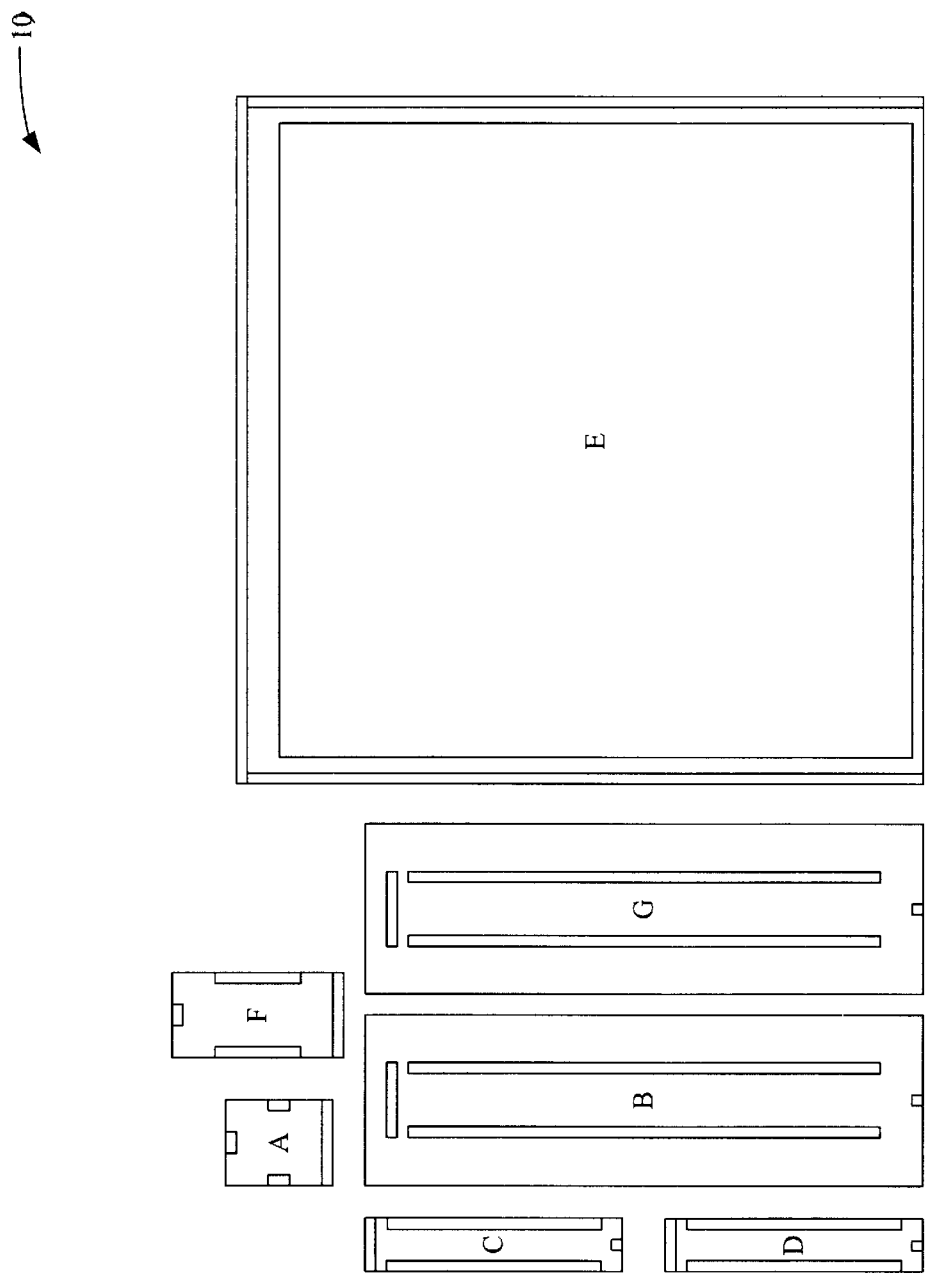
FIG. 1 illustrates schematically a representative layout of cells.

Methods in accordance with various embodiments of the invention provide the ability to automatically comply with device symmetry and, if necessary, device matching constraints in the computer aided design of an analog circuit layout. Device symmetry and device matching constraints are often necessary or desired requirements in RF and mixed-signal circuits. In accordance with one embodiment of the invention, symmetry and matching constraints are accommodated in a CAD tool by operating on sequence-pair topological representations of placement configurations. Configurations are then optimized using simulated annealing, a technique that has been discussed, for example, in S. Kirkpatrick, et al., "Optimization by Simulated Annealing," Science, Vol. 220, No. 4598, pp. 671–680, May 1983, the disclosure which is herein incorporated by reference. Simulated annealing algorithms use stochastically controlled hill-climbing to avoid local minima during the optimization process. In addition, the algorithms do not impose severe constraints on the size of the problem or on the mathematical properties of the cost function. The term "cost function" is used to mean a metric for the efficiency of the layout, and is often expressed analytically. The optimization involves trading off between a variety of layout factors such as area, total net length, aspect ratio, maximum chip width and/or height, cell orientation, and the like in order to reduce the cost function. At the present time simulated annealing is the most mature of the stochastic techniques utilized in cell layout optimization. Simulated annealing algorithms are well known and need not be described in further detail.

In the sequence-pair representation, any cell packing, in which the cell is depicted as a rectangle, is encoded as an ordered pair of cell sequences $(\alpha, \beta)$. Further details on sequence-pair representation are found in, H. Murata, et al., "VLSI Module Placement Based on Rectangle-Packing by the Sequence-Pair," IEEE Trans. On Comp.-Aided Design of IC's and Systems, Vol. 15, No. 12., pp. 1518–1524, December 1996, the disclosure of which is incorporated herein by reference. The Murata, et al. paper discloses a method for deriving such an encoding. In the sequence-pair representation there exists at least a sequence-pair encoding corresponding to (one of) the optimal rectangle packing. In addition, all the encodings are feasible in the sense that a placement configuration can be derived from any encoding. Moreover, the solution is optimal in terms of area and the solution can be constructed in finite time, where the time for solution is dependent on the number of cells involved in the layout. Because the total number of encodings is finite although large, the solution space can be effectively explored employing simulated annealing. The search space for m fixed-oriented cells has the size $(m!)^2$. If the cells can also be rotated or rotated and mirrored the size of the search space increases by a factor of $4^m$ or $8^m$, respectively.

Denoting by $\alpha_i$ the cell occupying the position i in sequence $\alpha$, and by $\alpha_A^{-1}$ the position of the cell $\alpha$ in the sequence, the topological relations between two cells A and B are given by:

if $\alpha_A^{-1} < \alpha_B^{-1}$ and $\beta_A^{-1} < \beta_B^{-1}$ then cell A is to the left of cell B;

if $\alpha_A^{-1} < \alpha_B^{-1}$ and $\beta_B^{-1} < \beta_A^{-1}$ then cell A is above cell B.

As an example of the use of sequence-pair encoding, the seven cell placement configuration 10 illustrated in FIG. 1 can be represented by $(\alpha,\beta)$=(CDAFBGE, DCBGAFE). In FIG. 1 the seven cells, representative of the cells of a small integrated circuit, have been designated by the letters A–F, to avoid confusion and to be consistent with the nomenclature common in sequence-pair representation, rather than by numerical designation common in the patent literature. In this encoding, as $\alpha_F^{-1} < \alpha_B^{-1}$ and $\beta_B^{-1} < \beta_F^{-1}$, it follows that cell F is positioned above cell B. Although the sequence-pair representation can be utilized in a general rectangle packing method, the technique or method must be modified in order to apply topological representation to analog placement in which the handling of symmetry constraints is a central requirement.

The layout of many integrated circuits, in particular high performance analog circuits, often requires groups of devices to be placed symmetrically with respect to one or more axes. The symmetric placement and routing is required to match the layout-induced parasitics in two halves of a group of devices. Failure to match these parasitics in differential analog circuits, for example, can lead to higher offset voltages and degraded power supply rejection ratios. Placement symmetry can also be used to reduce the circuit sensitivity to thermal gradients. Failure to adequately balance thermal couplings in a differential circuit can lead to drift and can even introduce unwanted oscillations. In order to combat potential-induced mismatches, thermally sensitive device couples should be placed symmetrically relative to thermally radiating devices.

Figure 2:
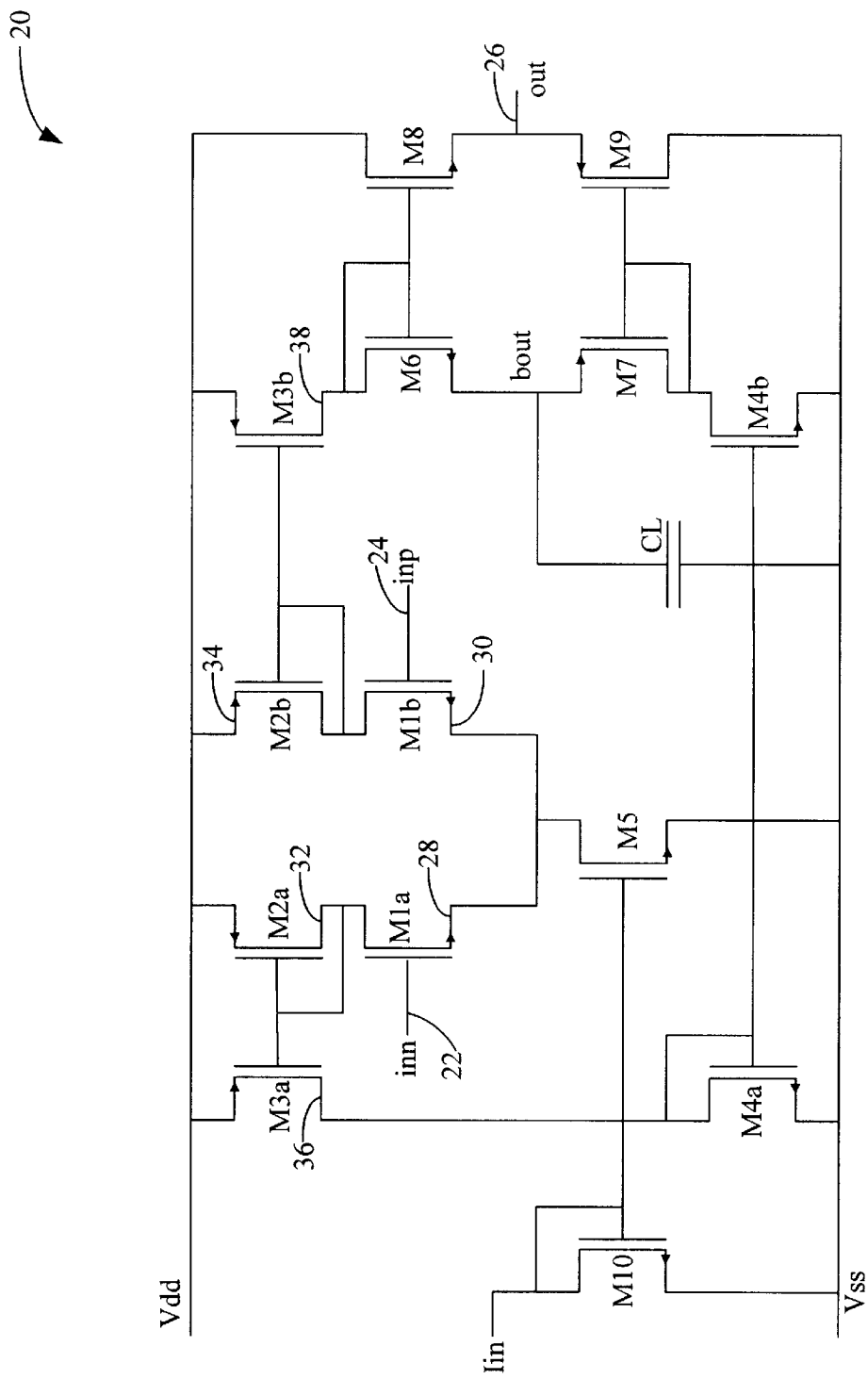
FIG. 2 illustrates an integrated circuit schematic containing both symmetric and asymmetric components.

A successful method for the automated packing of an integrated circuit layout should preferably be configured to accommodate mirror symmetry, perfect symmetry and self-symmetry. In addition, it is not unusual for an analog circuit to include a mix of symmetric and asymmetric components, and the method should accommodate such a mix. For example, FIG. 2 illustrates the schematic of a high speed CMOS comparator circuit 20 used in a CMOS A/D converter. This comparator converts a differential input signal into a single ended output value. Although it is not necessary to describe comparator circuit 20 in detail, it is apparent that the input stage is symmetric while the single ended output stage introduces an asymmetric part. Differential input signal is applied to inputs 22, 24 and the single ended output is taken at output 26. For optimum performance and minimized offset, device 28 is preferably symmetrically placed with respect to device 30, device 32 is symmetrically placed with respect to device 34, and device 36 is symmetrically placed with respect to device 38. The output does not require any symmetry.

If a given subset of the placeable cells in an integrated circuit layout must constitute a symmetry group, not all of the sequence-pair codes are feasible in view of such a symmetry constraint. For example, if the cell couple (CD) in the layout illustrated in FIG. 1 is required to be symmetric relative to a vertical axis, the encoding $(\alpha\beta)$=(CDAFBGE, DCBGAFE) is not feasible as it leads to a placement configuration where cell C is above cell D. To obtain the required coding, in accordance with the prior art methods, the search space $((m!)^2$ sequence-pairs) would be evaluated using the annealing algorithm. All encodings that were found to be infeasible in view of the symmetry constraint would be disregarded. Unfortunately, such a simple solution is not effective because of the large size of the search space.

The inventors have discovered, in accordance with the invention, methods for the automated packing of an integrated circuit layout space that yields an optimal solution in an efficient manner. As noted earlier, the search space for m fixed-oriented cells has the size $(m!)^2$. For even a moderately large value of m, the search space can be very large and the resulting computation very time consuming. The inventors have discovered, however, in accordance with an embodiment of the invention, that the size of the solution space becomes 24 times smaller if only two pairs of cells must form a symmetry group. This means that nearly 96% of the search space contains infeasible solutions if only two pairs of cells must form a symmetry group. With larger numbers of cells forming symmetry groups, the solution space becomes even smaller. By eliminating those solutions that are not symmetric-feasible, the search space can be reduced significantly, thus presenting a more tractable and efficient solution.

In accordance with one embodiment of the invention, an improved method for the automated packing of an integrated circuit layout having a plurality of cells explores only those sequence-pairs that comply with the symmetry constraints. Sequence-pairs that comply with the symmetry constraints are identified and the annealer exploration is restricted to only the subspace containing symmetric-feasible sequence-pairs.

Let $(\alpha,\beta)$ be the sequence-pair of a placement configuration containing a symmetry group y composed of several pairs of (mirrored/perfect) symmetric cells and self-symmetric cells relative to a common vertical axis. We denote by sym(x) the symmetric of cell x, and we consider by convention that sym(x)=x when x is a self-symmetric cell. The sequence-pair $(\alpha,\beta)$ is called symmetric-feasible if:

$\alpha^{-1}_x < \alpha^{-1}_y \Leftrightarrow \beta^{-1}_{sym(y)} < \beta^{-1}_{sym(x)}$, for all cell x, y in $\gamma$, x≠y.

This will hereinafter be referred to as the symmetric-feasibility condition.

Figure 3:
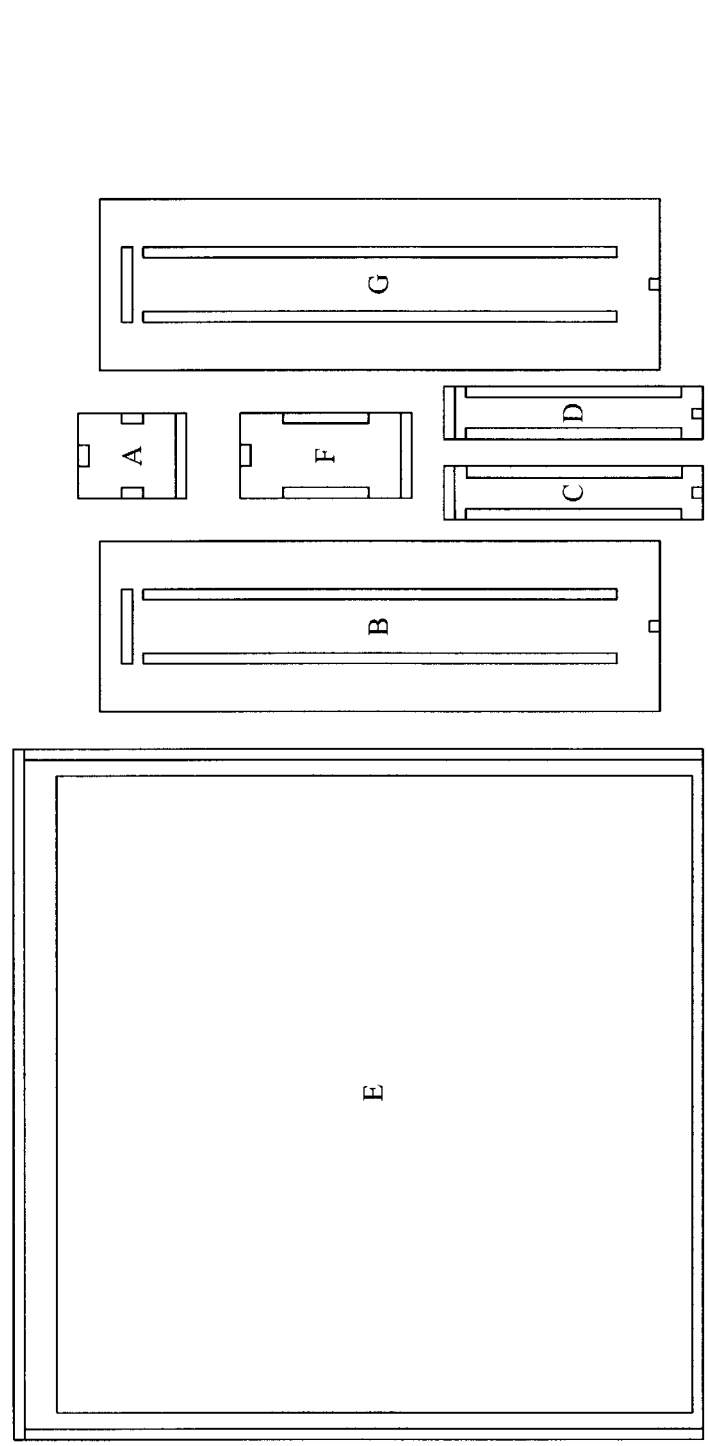
FIG. 3 illustrates schematically a representative layout of cells exhibiting symmetric subsets.

Choosing y=sym(x) and taking into account that sym(sym(x))=x, the symmetric-feasibility condition shows that any symmetric pair of cells appears in the same order in both sequences $\alpha$ and $\beta$. At the same time, the cells belonging to distinct symmetric pairs appear in reversed order in the two sequences of the encoding. Note also that the symmetric-feasibility condition can also be written as $\alpha^{-1}_{sym(y)} < \alpha^{-1}_{sym(x)} \Leftrightarrow \beta_x^{-1} < \beta_y^{-1}$, for all cells x, y in $\gamma$, x≠y For example, assuming there is a symmetry group $\gamma$=((C, D), (B, G), A, F) composed of two symmetric pairs and two self-symmetric cells A and F, the encoding $(\alpha,\beta)$= (CDAFBGE, DCBGAFE) representing the layout in FIG. 1 is not symmetric-feasible: the symmetric-feasibility condition is not valid for any of the pairs of cells (C, D), (C, B), (C, G), (C, A), (C, F), (D, B), (D, G), (D, A), (D, F), and (A, F). On the other hand, the encoding $(\alpha,\beta)$=(EBAFCDG, EBCDFAG) is symmetric-feasible; it has been derived from the placement solution of configuration 60 illustrated in FIG. 3. FIG. 3 thus illustrates a configuration of seven cells, A–F, representative of the cells of a small integrated circuit that includes two symmetric pairs and two self symmetric cells. Consistent with the nomenclature used in FIG. 1, the cells have been designated by letters rather than by numerical designation.

Any placement configuration containing a symmetry group can be encoded with a symmetric-feasible sequence-pair. If the encoding is done as described below, the resulting sequence-pair meets the symmetric-feasibility condition when applied to a placement configuration with a symmetry group. This technique is more fully explained in the article "Module Placement for Analog Layout Using the Sequence-Pair Representation," by Florin Balasa and Koen Lampaert, presented at the Design Automation Conference, June 1999 and published in the proceedings thereof, which article is incorporated herein, in its, entirety, by reference. In accordance with one embodiment of the invention, the encoding is done as follows:

sequence ConstructSequenceAlpha (set of m fixed, non-overlapping cells){
  // a similar procedure builds sequence β: the differences will be notified sequence α(resp., β) is initially zeroed;
  for k=1 to m{// k is the current position in the sequence
    let j be any cell which is not yet in the sequence α(resp., β);
    for (every cell i (≠j) not in the sequence){
      if the horizontal projections of cells i and j are overlapping
      then if cell i is above (resp., below) cell j then j=i
      else if cell i is to the left of cell j then j=i;
    }
    $\alpha_k$=j; (resp., $\beta_k$=j)
  }
  return sequence α(resp., (β));
}

By using this procedure the encoding generated will satisfy the symmetric-feasibility condition. By applying this encoding procedure to the placement configurations in FIGS. 1 and 3, the sequence-pairs (α,β)=(CDAFBGE, DCBGAFE) and, respectively (α,β)=(EBAFCDG, EBCDFAG) are obtained. The latter encoding is symmetric-feasible.

Continuing further with the technique in accordance with an embodiment of the invention, given a set of placeable cells containing a symmetry group and a symmetric-feasible sequence-pair, an optimal placement configuration (in terms of area) can be determined that satisfies the positioning and symmetry constraints by carrying out the following technique. If $x_i$, $y_i$ denote the coordinates of the left bottom corner of cell i (i=1, . . . , m) of width $width_i$ and $height_i$, and given a symmetric-feasible pair (α,β), the optimal placement configuration can be constructed by starting with x coordinates of the cells computed such that the positioning constraints (compatible with a given sequence-pair) are satisfied.

initialize $x_i$=0 (i=1, . . . , m) and symmetryAxis=0;
  for i=1 to m{
    j=$\alpha_i$; // choose cell j having the position i in sequence α
    for l=i+1 to m{
      k=$\alpha_l$; // for all cells k positioned after j in sequence α
      if $\beta_j^{-1}$<$\alpha_k^{-1}$ // if they are positioned after j also in sequence β
      then $x_k$=$x_k$ max ($x_j$+$width_j$)// then they are to the right of cell j
    }
    if cell j has a symmetric cell k (=sym (j)) such that $\alpha_k^{-1}$≦i
    // if cell j has a symmetric cell which is to its left (thus, $x_k$ is known), or it is self-symmetric
    then symmetryAxis=symmetryAxis max ($x_k$+$width_k$)+ $x_j$/2;
  }
}

This part of the algorithm determines the x coordinates of the cells such that the horizontal positioning constraints resulting from the sequence-pair (α,β) are satisfied. In the absence of a symmetry group, computation of the x coordinates is thus complete; otherwise (symmetryAxis>0) the x coordinates must be trimmed in order to satisfy the symmetric-feasibility condition. This is done in two steps: first a "sweep to the right" which finds the final x positions for the cells to the right of the symmetry axis, including the self-symmetric ones; second, a "sweep to the left" which determines the x positions of the cells to the left of the symmetry axis.

for i=1 to m{// the sweep to the right
    j=$\alpha_i$; // choose cell j having the position i in sequence β
    if cell j has a symmetric cell k (=sym (j)) such that $\alpha_k^{-1}$≦i then {
      // if cell j has a symmetric cell which is to its left, or it is self-symmetric
      d=2·symmetryAxis−($x_k$+$width_k$)−$x_j$; // a potential displacement for cell j
      if k=j then d=d/2; // if j is self-symmetric, the displacement is only half
      if d>0 then {
        $x_j$=$x_j$+d; // push cell j to the right
        for l=i+1 to m {
          k=$\alpha_l$; // all cells k to the right of j
          if $\beta_l^{-1}$<$\beta_k^{-1}$ then $x_k$=$x_k$+d; // are equally pushed to the right
        }
      }
    }
  }
  for i=m down to 1{// the sweep to the left
    j=$\alpha_i$; // choose cell j having the position i in sequence α
    if cell j has a symmetric cell k (=sym(j)) such that i<$\alpha_k^{-1}$ then {
      // if cell j has a symmetric which is to its right
      d=2·symmetryAxis−$x_j$−($x_k$+$width_k$); // a potential displacement for cell j
      if d<0 then {// displacement indeed
        $x_j$=$x_j$+d; / push cell j to the left
        for l=1 to i−1{
          k=$\alpha_l$; // all cells k to the left of j
          if $\beta_k^{-1}$<$\beta_j^{-1}$ then $x_k$=$x_k$+d; // are equally pushed to the left
        }
      }
    }
  }
}

The symmetric-feasibility condition is sufficient to ensure the correct x-positioning after only two sweeps: one to the right and one to the left. Finally, the y coordinates of the cells are computed also taking into account the symmetry such that the positioning constraints are satisfied. The steps include:

initialize $y_i$=0 (i=1, . . . , m);
  for i=m down to 1{
    j=$\alpha_i$; // choose cell j having the position i in sequence α
    for l=i−1 down to 1{
      k=$\alpha_l$; // for all cells k positioned before j in sequence β
      if $\beta_j^{-1}$<$\beta_k^{-1}$ then {// if they are positioned after j in sequence β
        $y_k$=$y_k$ max ($y_j$+$height_j$) // then they are above cell j
        if cell k has a symmetric cell k'(≠k) then $y_{k'}$=$y_k$;
      }
    }
  }
}

The symmetric-feasibility condition ensures that two symmetric cells are not one above the other and, at the same time, they are not one above and the other below another pair of symmetric cells. The correctness of the construction is therefore assured. In addition, a placement configuration built in this manner has a minimum width and height while satisfying the symmetry constraints. In so determining an optimal cell packing containing a symmetry group, it is not necessary to explore the entire space of $(m!)^2$ sequence-pairs; it suffices to explore the significantly smaller space of symmetric-feasible sequence-pairs. The annealing algorithm is adapted to explore the space of symmetric-feasible sequence-pairs subject to two conditions. First, the initial sequence-pair should be symmetric-feasible. Such a sequence-pair is, for example $$(\alpha,\beta)=(a_1 \ldots a_p c_1 \ldots c_s b_p \ldots b_1 \ldots, a_1 \ldots a_p c_s \ldots c_1 b_p \ldots b_1 \ldots)$$

where $(a_i,b_i)$, $i=1, \ldots, p$ are the pairs of symmetric cells and $c_j$, $j=1, \ldots, s$ are the self-symmetric cells. The initial sequence-pair can be built in different ways: tests by the inventors show that the choice is irrelevant with respect to CPU time and the quality of final solution. Second, the move-set of the annealer should be selected such that the property of symmetric-feasibility is preserved for all the visited sequence-pairs. The modifications of cell positions or cell interchanges in sequence $\alpha$ and/or $\beta$ are valid moves for the cells outside the symmetry group. However, if two cells from a distinct symmetric couple are interchanged in sequence $\alpha$, then their symmetric counterpart must also be interchanged in sequence $\beta$.

The requirement of several symmetry groups, that is, groups of cells having distinct symmetry axes, can be modeled in a similar way: the cells within every group must comply with the symmetric-feasibility condition. In addition, the construction of the placement solution from a given sequence-pair must be refined, along with the move-set of the annealing algorithm.

The symmetry about a horizontal symmetry axis can be equally modeled starting from the modified symmetric-feasibility condition:

$$\alpha_x^{-1} < \alpha_y^{-1} \Leftrightarrow \beta^{-1}_{sym(x)} < \beta^{-1}_{sym(y)}, \text{ for all cells } x, y \text{ in } \gamma, x \neq y$$

and inverting the construction of the x and y coordinates presented in the technique above. In a similar manner, within the sequence-pair representation, any number of vertical and horizontal symmetry axes can be modeled.

The degree to which electrical properties of identically specified components fail to match can often limit the circuit performance in analog design. Device mismatches may be due to random events in the manufacturing process, which lead to small unpredictable variations in the electrical characteristics of devices, or to dissimilar geometrical choices for matching devices during the design process. The effects of the latter systematically induced mismatches can be minimized by proper handling during the automated packing of the integrated circuit layout. For example, in order to reduce the degree of electrical mismatch due to area effects, matching groups of cells can be defined and each of the matching cells can be constrained to the same orientation and device variant. In accordance with one embodiment of the invention, the subset of matching cells are identified and constraints are defined for that subset. The matching groups are then accommodated as constraints at the move-set level of the annealer.

The method in accordance with an embodiment of the invention has been described and illustrated using sequence-pair encoding. The method in accordance with a further embodiment of the invention can also be carried out using topological representation. For example, in addition to using sequence-pair representation, O-tree representation as described, for example in P. N. Guo, et al., "An O-tree representation of non-slicing floorplan and its applications," Proc. $36^{th}$ ACM/IEEE Design Automation Conf., pp. 268–273m June 1999, and bounded slice line grid representation as described, for example in S. Nakatake, et al., "Module packing based on the BSG-structure and IC layout applications," IEEE Trans on Comp.-Aided Design of IC's and Systems, Vol. 17, No. 6, pp. 519–530, June 1998, can also be used. The disclosure of the Guo, et al. and Nakatake, et al. papers are incorporated herein by reference. The general principles of O-tree representation and bounded-slice line grid representation are well known to those of skill in the art and need not be described further.

Further, the method in accordance with one embodiment of the invention has been described in terms of using simulated annealing. In addition, in accordance with a further embodiment of the invention, the method is applicable to other stochastic techniques such as genetic algorithms as described in J. Cohoon, W. Paris, "Genetic Placement," IEEE Trans. On Comp-Aided Design of IC's and Systems, Vol. 6, No. 6, pp. 956–964, November 1987 the disclosure of which is hereby incorporated by reference.

Thus it is apparent that there has been provided, in accordance with the invention, a method for the automated placement of cells in an integrated circuit layout which fully meets the needs set forth above. The practical effect and the efficiency of the method can be more fully appreciated by considering the results set forth in the above-referenced Balasa and Lampaert article. Other elements of integrated circuit layout such as routing, compaction, design rule checking, and the like, as are well known in the art, can be applied following the cell placement. Although the invention has been described and illustrated with reference to specific embodiment thereof, it is not intended that the invention be limited to these illustrative embodiments. Instead it is intended that the invention encompass all such variations and modifications as fall within the scope of the appended claims.

What is claimed is:

1. A method for the automated packing of an integrated circuit layout having a plurality of cells, the method comprising the steps of:

identifying from the plurality of cells a subset of cells for which substantial symmetry is desired;

defining symmetry constraints for the subset;

encoding the packing of the cells as ordered sequence-pairs; and optimizing the encoding using simulated annealing subject to the symmetry constraints.

2. The method of claim 1 wherein the step of encoding comprises selecting an initial sequence-pair that is symmetric-feasible.

3. The method of claim 2 wherein the step of optimizing comprises utilizing a move-set selected such that the property of symmetric-feasibility is preserved for all visited sequence-pairs.

4. The method of claim 1 further comprising the steps of:

identifying from the plurality of cells a second subset of cells that must be matched;

defining matching constraints for the second subset; and optimizing the encoding subject to the matching constraints in addition to the symmetry constraints.

5. The method of claim 1 wherein the identifying step is performed without constructing a placement configuration.

6. A method for the automated placement of a plurality of cells in an integrated circuit layout, the method comprising the steps of:

identifying from the plurality of cells a subset of cells for which substantial symmetry is desired;

defining symmetry constraints for the subset;

representing the plurality of cells in a topological representation subject to the symmetry constraints; and optimizing the representation by a stochastic technique, maintaining the symmetry constraints during the optimization.

7. The method of claim 6 wherein the step of defining symmetry constraints comprises defining constraints with respect to one of a vertical or a horizontal axis.

8. The method of claim 6 wherein the step of defining symmetry constraints comprises defining constraints with respect to a plurality of vertical and horizontal axes.

9. The method of claim 6 wherein the stochastic technique comprises simulated annealing.

10. The method of claim 6 wherein the stochastic technique comprises genetic algorithms.

11. The method of claim 6 wherein the topological representation is a sequence-pair representation.

12. The method of claim 6 wherein the topological representation is an O-tree representation.

13. The method of claim 5 wherein the topological representation is a bounded-sliceline grid.

14. The method of claim 6 wherein the topological representation is a binary-tree representation.

15. The method of claim 6 wherein the identifying step is performed without constructing a placement configuration.

16. A method for the automated design of an integrated circuit layout wherein the circuit comprises a plurality of cells, the method comprising the steps of:

identifying from the plurality of cells a first subset of cells that must exhibit symmetry;

defining symmetry constraints for the first subset of cells;

identifying from the plurality of cells a second subset of cells that must exhibit matching;

defining matching constraints for the second subset of cells;

representing the placement configurations of the plurality of cells as sequence-pair topological representations subject to the symmetry constraints and the matching constraints;

optimizing the placement configurations using simulated annealing; and restricting the annealing to only those configurations that are both symmetry feasible and matching feasible.

17. A method for the automated design of an integrated circuit layout wherein the circuit comprises a plurality of cells, the method comprising the steps of:

identifying from the plurality of cells a first subset of cells that must exhibit symmetry with respect to a first axis of symmetry;

defining first symmetry constraints for the first subset of cells;

determining a sequence-pair encoding of the cells that meets the first symmetry constraints; and restricting exploration of further encodings of the cells to a subspace containing symmetry-feasible sequence-pairs.

18. The method of claim 17 wherein the step of restricting exploration comprises limiting exploration to only that subspace containing symmetry-feasible sequence pairs.

19. The method of claim 17 wherein the plurality of cells comprise an analog integrated circuit.

20. The method of claim 17 further comprising the steps of:

identifying from the plurality of cells a second subset of cells that must exhibit symmetry with respect to a second symmetry axis;

definding second symmetry constraints for the second subset of cells; and determining a sequence-pair encoding of the plurality of cells that meets the second symmetry constraints in addition to the first symmetry constraints.

* * * * *